United States Patent
Yang (10) Patent No.: US 9,853,025 B1
(45) Date of Patent: Dec. 26, 2017

(54) THIN FILM METALLIC RESISTORS FORMED BY SURFACE TREATMENT OF INSULATING LAYER

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/294,241

(22) Filed: Oct. 14, 2016

(51) Int. Cl.
*H01L 21/00* (2006.01)
*H01L 27/08* (2006.01)
*H01L 49/02* (2006.01)

(52) U.S. Cl.
CPC .......... *H01L 27/0802* (2013.01); *H01L 28/24* (2013.01)

(58) Field of Classification Search
CPC ............................ H01L 27/0802; H01L 28/24
See application file for complete search history.

(56) References Cited

U.S. PATENT DOCUMENTS

| | | | |
|---|---|---|---|
| 4,141,020 A * | 2/1979 | Howard et al. ... | H01L 21/28537 257/486 |
| 4,464,701 A * | 8/1984 | Roberts et al. .......... | H01G 4/20 257/532 |
| 5,485,138 A | 1/1996 | Morris | |
| 6,013,576 A * | 1/2000 | Oh et al. ............. | C23C 16/0227 257/E21.584 |
| 6,083,785 A | 7/2000 | Segawa et al. | |
| 6,207,560 B1 | 3/2001 | Lee | |
| 6,232,042 B1 | 5/2001 | Dunn et al. | |
| 6,287,910 B2 * | 9/2001 | Lee et al. ............... | H01L 21/318 257/E21.008 |
| 6,534,360 B2 * | 3/2003 | Narwankar et al. ........................ | H01L 21/31604 257/E21.008 |
| 8,530,320 B2 * | 9/2013 | Yang et al. ......... | H01L 23/5228 257/E21.006 |
| 9,443,982 B1 * | 9/2016 | Balakrishnan et al. ................. | H01L 29/66742 |
| 9,653,289 B1 * | 5/2017 | Balakrishnan et al. ..................... | H01L 27/088 |
| 9,735,103 B1 * | 8/2017 | Yang ................... | H01L 23/5252 |
| 2004/0027234 A1 | 2/2004 | Hashimoto et al. | |
| 2005/0184397 A1 * | 8/2005 | Gates et al. ...... | H01L 21/76801 257/774 |

(Continued)

*Primary Examiner* — Laura Menz (74) *Attorney, Agent, or Firm* — Louis J. Percello; Ryan, Mason & Lewis, LLP (57) ABSTRACT

A semiconductor device having an integrated thin film metallic resistor device which is formed by a process which includes depositing a conformal layer of insulating material on a substrate, wherein the conformal layer of insulating layer is formed with an initial thickness T, applying a surface treatment to a surface of the conformal layer of insulating material to convert the surface of the conformal layer of insulating material to a layer of conductive metallic material of thickness $T_1$, which is less than T, and forming device contacts to portions of the layer of conductive metallic material. The layer of conductive metallic material and the device contacts form a thin film metallic resistor device. As an example, the conformal layer of insulating material includes $Ta_3N_5$, and the layer of conductive metallic material that is formed by the surface treatment includes TaN.

10 Claims, 7 Drawing Sheets

(56) References Cited

U.S. PATENT DOCUMENTS

| | | | |
|---|---|---|---|
| 2005/0275104 A1* | 12/2005 | Stamper | H01L 21/31116 257/758 |
| 2007/0194405 A1* | 8/2007 | Hsu et al. | H01L 21/02126 257/522 |
| 2009/0039331 A1* | 2/2009 | Clevenger et al. | G11C 13/0004 257/4 |
| 2009/0045388 A1* | 2/2009 | Clevenger et al. | G11C 17/165 257/4 |
| 2010/0055442 A1* | 3/2010 | Kellock et al. | C23C 16/36 428/319.1 |
| 2011/0018100 A1* | 1/2011 | Nakagawa et al. | H01L 21/02178 257/532 |
| 2012/0313220 A1* | 12/2012 | Yang et al. | H01L 23/5228 257/537 |
| 2013/0341731 A1* | 12/2013 | Chen et al. | H01L 27/0629 257/379 |
| 2014/0008764 A1* | 1/2014 | Yang et al. | H01L 23/5228 257/537 |
| 2016/0379876 A1* | 12/2016 | Farooq et al. | H01L 21/76856 257/532 |

* cited by examiner

THIN FILM METALLIC RESISTORS FORMED BY SURFACE TREATMENT OF INSULATING LAYER

TECHNICAL FIELD

This disclosure generally relates to semiconductor fabrication techniques and, in particular, techniques for fabricating thin film metallic resistors for semiconductor integrated circuitry.

BACKGROUND

On-chip resistor devices, such as thin film metallic resistors, are utilized in semiconductor integrated circuits for various applications. Thin film metallic resistors are typically formed within BEOL (back of line) interconnect structures by depositing metal films and using damascene or subtractive etch techniques. There are various technical issues, however, associated with thin film metallic resistors. For example, a process flow to fabricate integrated thin film metallic resistors as part of a BEOL interconnect structure can be complicated and expensive because the fabrication of integrated thin film metallic resistors can require multiple deposition and lithographic masking steps. Moreover, the embedded layers of materials that are used to fabricate the thin film metallic resistors elements may cause topography issues that degrade a final chip yield. Furthermore, thin film metallic resistors have a limited scaling capability based on the dimension limitations. For example, in high-density integrated circuitry, the footprint area (width times length) occupied by a two-dimensional thin film metallic resistor structure should be minimized, which in turn, places a limit on the magnitude of the resistance that can be achieved with a two-dimensional thin film metallic resistor structure.

SUMMARY

Embodiments of the invention include semiconductor devices having integrated metallic resistor devices that are formed by surface treating an insulating layer to form conductive thin film metallic resistor layers, as well as methods for fabricating integrated metallic resistor devices by surface treating an insulating layer to form conductive thin film metallic resistor layers.

In one embodiment, a method for fabricating a semiconductor device comprises: depositing a conformal layer of insulating material on a substrate, wherein the conformal layer of insulating layer is formed with an initial thickness T; applying a surface treatment to a surface of the conformal layer of insulating material to convert the surface of the conformal layer of insulating material to a layer of conductive metallic material of thickness $T_1$, which is less than T; and forming device contacts to portions of the layer of conductive metallic material. The layer of conductive metallic material and device contacts comprise a thin film metallic resistor device.

Another embodiment includes a method for fabricating a semiconductor device, which comprises: forming a stack of insulating layers on a substrate; patterning the stack of insulating layers to form an opening in the stack of insulating layers down to the substrate, wherein the opening comprises vertical sidewalls; laterally recessing exposed sidewall surfaces of every other insulating layer in the stack of insulating layers to a recess depth D to form a meandering sidewall topology on the vertical sidewalls; depositing a conformal layer of insulating material over the patterned stack of insulating layers, wherein the conformal layer of insulating layer is formed with an initial thickness T; applying a surface treatment to a surface of the conformal layer of insulating material to convert the surface of the conformal layer of insulating material to a layer of conductive metallic material of thickness $T_1$, which is less than T; patterning the layer of conductive metallic material to form a thin film metallic resistor layer; depositing a layer of dielectric material to form an insulating air gap in the opening in the stack of insulating layers; and forming device contacts in the layer of dielectric material in contact with portions of the thin film metallic resistor layer.

Another embodiment of the invention includes a semiconductor device which comprises a conformal layer of insulating material disposed on a substrate, and a thin film metallic resistor layer disposed on the conformal layer of insulating material. The thin film metallic resistor layer comprises a layer of conductive metallic material that is formed by application of a surface treatment to a surface of the conformal layer of insulating material to convert the surface of the conformal layer of insulating material to the layer of conductive metallic material. In one example embodiment, the conformal layer of insulating material comprises insulating $Ta_3N_5$ material, and the layer of conductive metallic material comprises conductive TaN material.

In one embodiment, the conformal layer of insulating material and the thin film metallic resistor layer are formed as part of a middle-of-the-line (MOL) layer of the semiconductor device. In another embodiment, the conformal layer of insulating material and the thin film metallic resistor layer are formed as part of a back-end-of-line (BEOL) layer of the semiconductor device.

Other embodiments will be described in the following detailed description of embodiments, which is to be read in conjunction with the accompanying figures.

BRIEF DESCRIPTION OF THE DRAWINGS

FIGS. 2 through 9 schematically illustrate a method for fabricating the semiconductor device of FIGS. 1A and 1B, according to an embodiment of the invention, wherein:

DETAILED DESCRIPTION

Embodiments will now be described in further detail with regard to semiconductor integrated circuit devices having integrated thin film metallic resistor devices that are formed as part of BEOL (back-end-of-line) and/or MOL (middle-of-the-line) layers, as well as methods for fabricating thin film metallic resistor devices as part of BEOL and/or MOL layers of a semiconductor integrated circuit device. As explained in further detail below, embodiments of the invention include methods to fabricate a thin film metallic resistor device by depositing an insulating layer and applying a controlled surface treatment to a surface of the insulating layer to convert the surface of the insulating layer into a conductive metallic layer which serves as thin film resistor layer of an integrated metallic resistor device. This process enables precise control of the thickness of the thin film metallic resistor layer and thus, allows for scalability of ultra-thin film metallic layers for metallic resistor devices.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. To provide spatial context to the different structural orientations of the semiconductor structures shown throughout the drawings, XYZ Cartesian coordinates are shown in each of the drawings. It is to be understood that the term "vertical" as used herein denotes a Z-direction of the Cartesian coordinates shown in the drawings, and that the terms "horizontal" or "lateral" as used herein denotes an X-direction and/or Y-direction of the Cartesian coordinates shown in the drawings, which is perpendicular to the Z-direction.

Figure 1A:
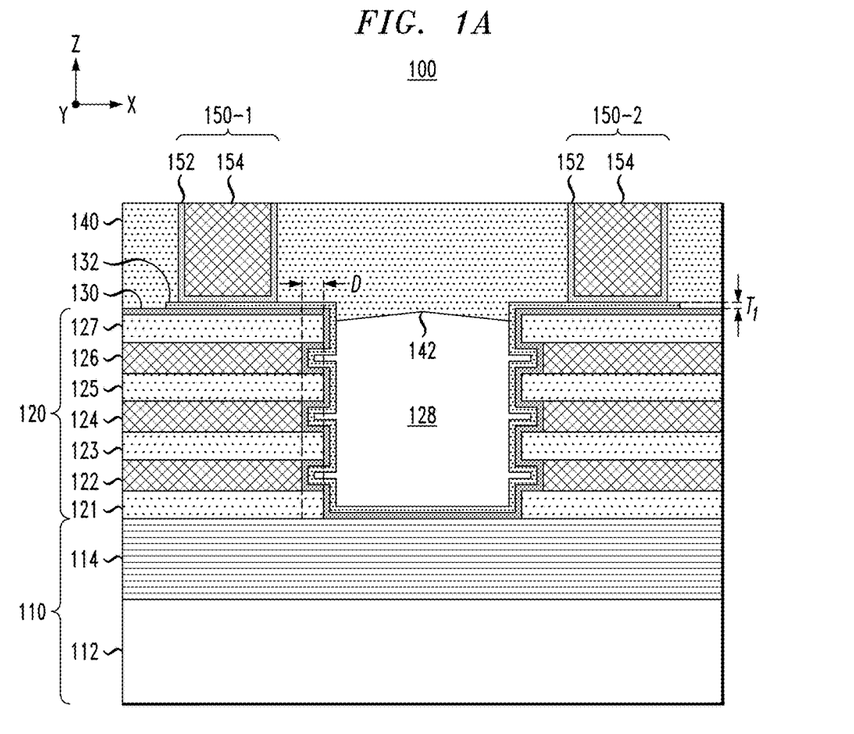
FIGS. 1A and 1B are schematic views of a semiconductor device comprising an integrated thin film metallic resistor device according to an embodiment of the invention.
Figure 1B:
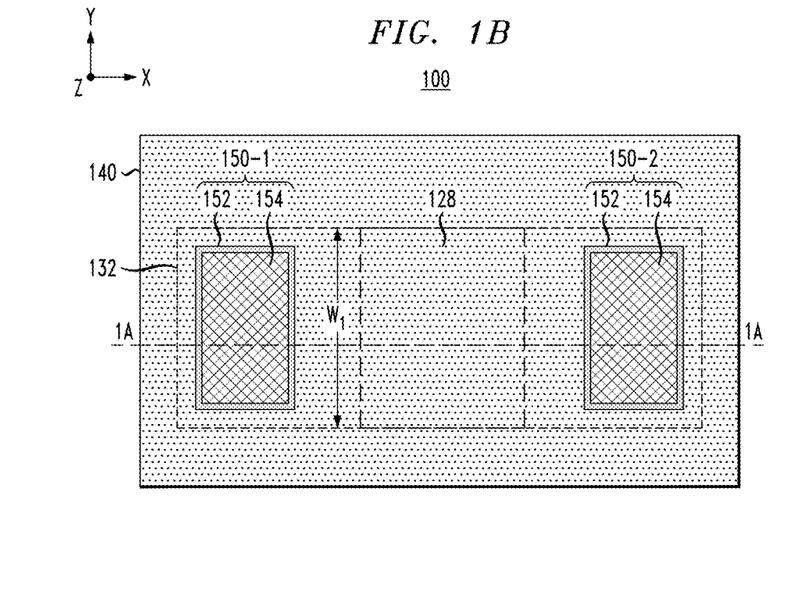

FIGS. 1A and 1B are schematic views of a semiconductor device 100 comprising an integrated thin film metallic resistor device, according to an embodiment of the invention. In particular, FIG. 1A is a cross-sectional schematic side view of the semiconductor device 100 taken along line 1A-1A in FIG. 1B, and FIG. 1B is a schematic top plan view of the semiconductor device 100 of FIG. 1A. Referring to FIG. 1A, the semiconductor device 100 comprises a substrate 110, stack of insulating layers 120, and insulating air gap 128, an insulating layer 130, a thin film metallic resistor layer 132, a dielectric layer 140, and device contacts 150-1 and 150-2. The stack of insulating layers 120 comprises a plurality of insulating layers 121, 122, 123, 124, 125, 126, and 127.

The device contacts 150-1 and 150-2 each comprise a liner layer 152 and a metal material 154. The device contacts 150-1 and 150-2 are formed by etching contact openings (e.g., trenches or vias) in the dielectric layer 140 in alignment with end portions of the thin film metallic resistor layer 132, lining the contact openings with a conformal layer of liner material to form the liner layers 152, and filling the contact openings with the metal material 154. The liner layers 152 serve as barrier diffusion layers to prevent migration of the metal material 154 (e.g., Cu) into the dielectric layer 140, as well as adhesion layers to provide good adhesion to the metal material 154 (e.g., Cu) that is used to fill the contact openings that are formed in the dielectric layer 140.

In the example embodiment of FIGS. 1A and 1B, the thin film metallic resistor layer 132 and the device contacts 150-1 and 150-2 comprise an integrated metallic resistor device, according to an embodiment of the invention. The stack of insulating layers 120 is patterned to form a surface topography that comprises both lateral and vertical surfaces, which define a length (denoted $L_1$) of the thin film metallic resistor layer 132 between the first and second device contacts 150-1 and 150-2. For example, the stack of insulating layers 120 is patterned to form an opening (e.g., opening 128A, FIG. 3), which defines vertical sidewalls on which the thin film metallic resistor layer 132 is formed. As explained in further detail below, the opening formed in the stack of insulating layers 120 is subsequently converted to the insulating air gap 128 (shown in FIGS. 1A and 1B) by forming the dielectric layer 140 using a "pinch-off" deposition process which results in the formation of a "pinch-off" region 142 that closes the opening to form the insulating air gap 128.

In a further embodiment, as shown in FIG. 1A, the exposed sidewall surfaces of every other one of the insulating layers (e.g., insulating layers 122, 124, 125) in the stack of insulating layers 120 is laterally recessed to target recess depth D to form a meandering sidewall topology. The meandering sidewall topology of the patterned stack of insulating layers 120 serves to increase a surface area on which the thin film metallic resistor layer 132 is formed which, in turn, further increases the length L1 of the thin film metallic resistor layer 132 in the direction of current flow along the thin film metallic resistor layer 132 between the first and second device contacts 150-1 and 150-2.

As is known in the art, the resistance R of a thin metallic film is determined as: $R=\rho/T \times L/W$ wherein $\rho$ denotes a resistivity of the metallic material, T denotes a thickness of the metallic film, L denotes a length of the metallic film in the direction of current flow, and wherein W denotes a width of the metallic film (in a direction perpendicular to the current flow). In this regard, for a given metallic material with a given resistivity $\rho$, the resistance R of a thin metallic film increases with length L, and decreases with an increase in cross-sectional surface area $(T) \times (W)$ (e.g., increase in thickness T and/or width W). In the example embodiment of FIGS. 1A and 1B, the thin film metallic resistor layer 132 comprises a width $W_1$ (shown in FIG. 1B) and a thickness $T_1$ (shown in FIG. 1A). In particular, as shown in FIG. 1B, the thin film metallic resistor layer 132 (lateral footprint depicted by a dashed rectangle in FIG. 1B) comprises a width $W_1$ in a direction that is perpendicular to the current flow along the thin film metallic resistor layer 132 between the device contacts 150-1 and 150-2.

Moreover, as noted above, a length of the thin film metallic resistor layer 132 (as shown in FIG. 1A) is defined by (i) the lateral length portions of the thin film metallic resistor layer 132 on the upper surface of the stack of insulating layers 120 and on the bottom of the insulating air gap 128, and (ii) the vertical/lateral length portions defined by the meandering sidewall surfaces of the stack of insulating layers 120 surrounding the insulating air gap 128. In the example embodiment of FIGS. 1A and 1B, the length of the thin film metallic resistor layer 132 can be modulated by, e.g., changing the thickness of the stack of insulating layers 120, changing the recess depth D, etc.

As compared to a planar thin film metallic resistor which has a two-dimensional footprint topology (L×W), a thin film metallic resistor device as shown in FIGS. 1A/1B comprises a three-dimensional footprint topology that is realized by smooth vertical sidewalls or recessed/meandering vertical sidewalls of the patterned stack of insulating layers 120, which effectively increases the length of the thin film metallic resistor layer 132 for a given lateral footprint area, as compared to a smaller, maximum length of a planar thin film metallic layer that could be realized for the given lateral footprint area. In this regard, a relatively large resistance can be achieved in a relatively small lateral footprint region by implementing a thin film metallic resistor device as shown in FIGS. 1A and 1B.

In another embodiment of the invention, the target thickness $T_1$ of the thin film metallic resistor layer 132 can be precisely controlled using methods described herein, which allows for scalability in the resistance of ultra-thin film metallic layers for metallic resistor devices. As explained in further detail below, embodiments of the invention include methods to fabricate the thin film metallic resistor layer 132 by depositing a layer of insulating material (e.g., insulating 130A shown in FIG. 5) with an initial thickness T, and applying a controlled surface treatment to a surface of the insulating layer to convert a target thickness $T_1$ of the upper surface of the insulating layer into a layer of conductive metallic material, which is then patterned to form the thin film metallic resistor layer 132 of the integrated metallic resistor device. The insulating layer 130 shown in FIG. 1A comprises a remaining portion of the original layer of insulating material which is not converted into a conductive metallic material by the surface treatment. The insulating layer 130 serves as an insulating/barrier diffusion layer between the insulating material of the stack of insulating layers 120 and the thin film metallic resistor layer 132.

It is to be understood that a thin film metallic resistor device according to an embodiment of the invention can be integrally formed as part of a MOL and/or a BEOL process flow. In this regard, in one embodiment, the stack of insulating layers 120 is formed as part of a MOL layer of the semiconductor device 100. In another embodiment, the stack of insulating layers 120 is formed as part of a BEOL layer of the semiconductor device 100. In FIG. 1A, the substrate 110 is generically depicted as comprising an underlying base semiconductor substrate 112 (e.g., semiconductor wafer) and a device/layer stack 114. The device/layer stack 114 comprises integrated circuity and interconnect layers/structures that are formed on the base semiconductor substrate 112 prior to formation of stack of insulating layers 120.

In one embodiment, the base semiconductor substrate 112 comprises a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the base semiconductor substrate 112 may be a SOI (silicon on insulator) substrate, which comprises an insulating layer (e.g., oxide layer) disposed between a base substrate layer (e.g., silicon substrate) and an active semiconductor layer (e.g., active silicon layer) in which active circuit components (e.g., field effect transistors) are formed as part of a FEOL (front-end-of-line) layer.

Furthermore, in alternate embodiments, the device/layer stack 114 comprises a FEOL layer, a MOL layer (or at least a portion of the MOL layer), and/or a BEOL layer (or at least a portion of the BEOL layer). As is known in the art, a FEOL layer comprises various semiconductor devices and components that are formed in or on the active surface of the semiconductor substrate 112 to provide integrated circuitry for a target application. For example, the FEOL layer comprises FET devices (such as FinFET devices, planar MOSFET device, etc.), bipolar transistors, diodes, capacitors, inductors, resistors, isolation devices, etc., which are formed in or on the active surface of the semiconductor substrate 112. In general, FEOL processes typically include preparing the semiconductor substrate 112 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

Furthermore, a MOL layer is formed on the FEOL layer. In general, the MOL layer comprises one or more PMD (pre-metal dielectric) layers and conductive contacts (e.g., via contacts) that are formed in the PMD layer. The PMD layer is formed over the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure.

A BEOL structure is formed on the FEOL/MOL structure to connect the various integrated circuit components of the FEOL layer. As is known in the art, a BEOL structure comprises multiple levels dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metal material to form a network of electrical connections between the FEOL devices and to provide I/O connections to external components.

In one example embodiment, the integrated thin film metallic resistor device (comprising elements 132, 150-1 and 150-2) shown in FIG. 1A can be integrally formed as part of a MOL process flow in which the device contacts 150-1 and 150-2 are integrally formed as part of the metallization and dielectric layers that are used to form other MOL device contacts (e.g., drain, source, and gate contacts of field-effect transistor devices) and devices/components that are integrated within the MOL layer. In another embodiment, the integrated thin film metallic resistor device can be integrally formed as part of a BEOL process flow in which the device contacts 150-1 and 150-2 are integrally formed as part of the metallization and dielectric layers that are used to form BEOL interconnect structures (e.g., wiring and vertical vias).

Figure 2:
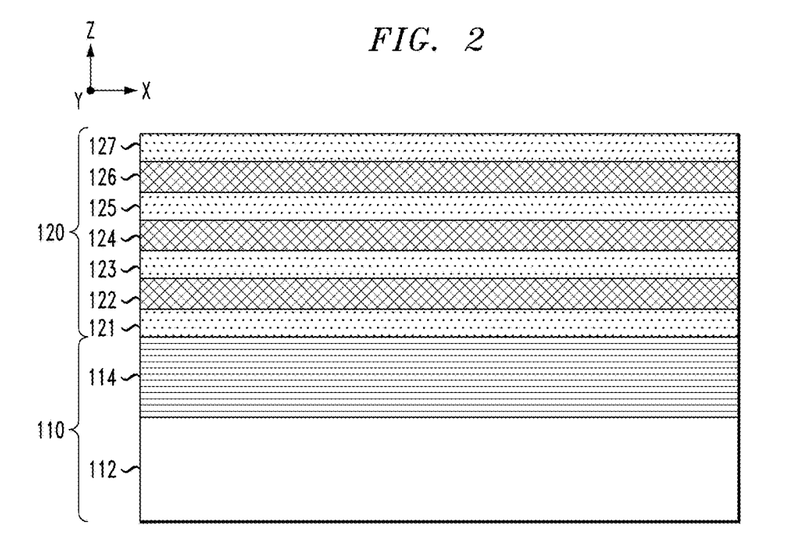
FIG. 2 schematically illustrates the semiconductor device of FIG. 1A at an intermediate stage of fabrication after depositing a stack of insulating layers on a substrate.

Methods for fabricating the semiconductor device 100 of FIG. 1 will now be discussed in further detail with reference to FIGS. 2 through 10, which schematically illustrate the semiconductor device 100 of FIG. 1 at various stages of fabrication. To begin, FIG. 2 schematically illustrates the semiconductor device 100 of FIG. 1 at an intermediate stage of fabrication after FIG. 2 after depositing the stack of insulating layers 120 on the substrate 110. As noted above, in alternate embodiments of the invention, it is assumed that the device/layer stack 114 in FIG. 2 comprises, for example, a FEOL layer only, or a FEOL layer and at least initial layers of a MOL layer, or a FEOL layer and completed MOL layer, or a FEOL layer, a MOL layer, and initial layers of a BEOL layer. In such embodiments, the stack of insulating layers 120 is deposited as part of a MOL process module or a BEOL process module.

As noted above, the stack of insulating layers 120 comprises a plurality of insulating layers 121, 122, 123, 124, 125, 126 and 127 which are sequentially deposited using known techniques. In one embodiment of the invention, the insulating layers 121, 123, 125 and 127 are formed of a first type of insulating material, and the insulating layers 122, 124, and 126 are formed of a second type of insulating material which has etch selectivity with respect to the first type of insulating material. For example, in one embodiment, the first type of insulating material (e.g., insulating layers 121, 123, 125, and 127) comprises a carbide-based insulating material such as SiC, SiCH, or SiCHO, and the second type of insulating (e.g., insulating layers 122, 124, and 126) comprises a carbon-free insulating material such as silicon oxide (e.g., $SiO_2$).

As noted above, the thickness and amount of insulating layers in the stack of insulating layers 120 will vary depending on the target resistance of the thin film metallic resistor layer 132 that is to be formed. In particular, as the number of insulating layers and/or thickness of the insulating layers increases, the greater the length $L_1$ of the thin film metallic resistor layer 132, which effectively increases the resistance of the thin film metallic resistor device (for a given width $W_1$ and thickness $T_1$ and type of conductive metallic material). For example, in one embodiment, the number of insulating layers is in a range of 3 to 50, and the thickness of each insulating layer is in a range of about 1 nm to about 300 nm.

Figure 3:
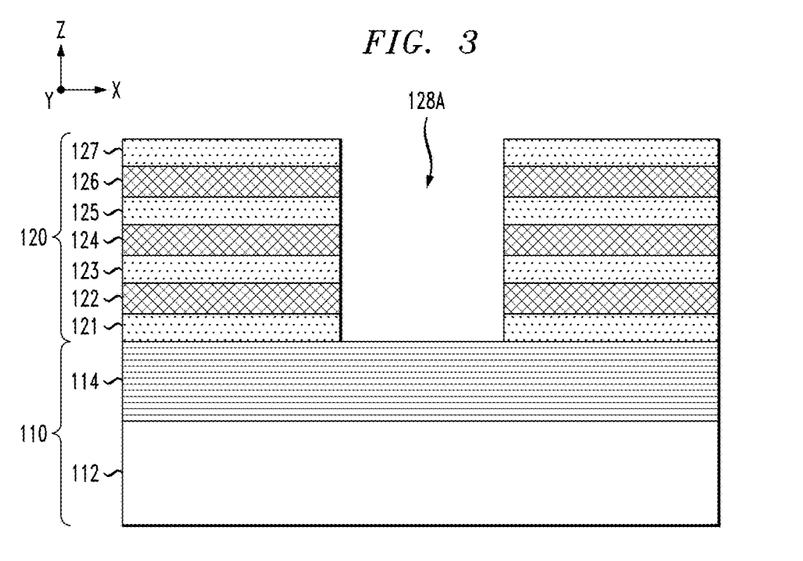
FIG. 3 is a cross-sectional schematic side view of the semiconductor structure of FIG. 2 after patterning the stack of insulating layers to form an opening in the stack of insulating layers down to the substrate.

A next stage of the fabrication process comprises patterning the stack of insulating layers 120 to form a surface topography that defines dimensions (e.g., length $L_1$ and width $W_1$) of the thin film metallic resistor to be formed. For example, FIG. 3 is a cross-sectional schematic side view of the semiconductor structure of FIG. 2 after patterning the stack of insulating layers 120 to form an opening 128A in the stack of insulating layers 120 down to the substrate 110. The opening 128A can be formed using photolithographic patterning techniques. The lateral size of the opening 128A (e.g., length (X-direction) and width (Y-direction)) will vary depending on the target size of the thin film metallic resistor device to be formed. The opening 128A may comprise a square-shaped via opening (width=length) or a rectangular trench opening (e.g., width>length).

Figure 4:
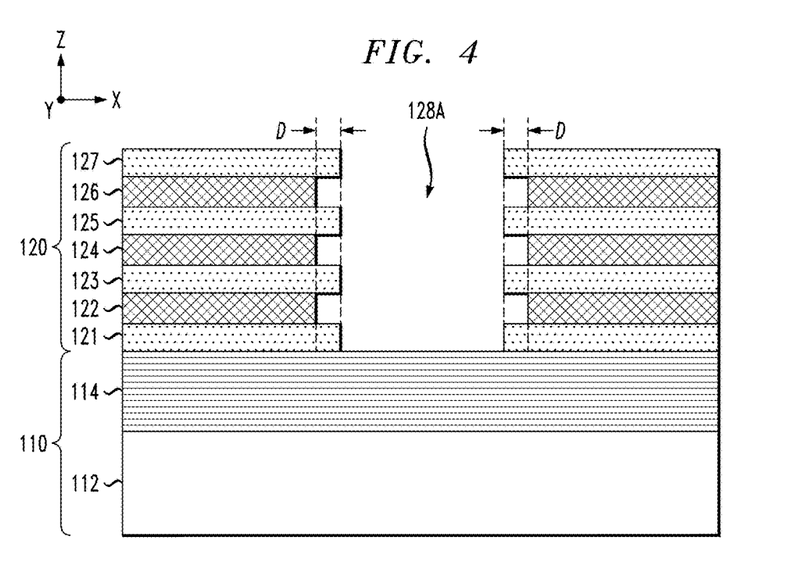
FIG. 4 is a cross-sectional schematic side view of the semiconductor structure of FIG. 3 after laterally recessing sidewall surfaces of every other one of the insulating layers exposed through the opening in the stack of insulating layers.

Next, FIG. 4 is a cross-sectional schematic side view of the semiconductor structure of FIG. 3 after laterally recessing sidewall surfaces of the insulating layers 122, 124 and 126 exposed through the opening 128A in the stack of insulating layers 120. As shown in FIG. 4, the sidewall surfaces of the insulating layers 122, 124, and 126 are recessed to a depth, D. In one embodiment of the invention, the lateral etch process can be performed using a wet etch process with an etch solution (e.g., a dilute HF (hydrofluoric action) solution (e.g., ratio of water:HF of 100:1)) to etch the oxide-based insulating material of the layers 122, 124, and 126 selective to the insulating material (e.g., carbide-based insulating material) of the other layers 121, 123, 125 and 127. In another embodiment, a dry plasma etch process can be performed with an etch chemistry that is suitable to laterally etch the sidewall surfaces of the insulating layers 122, 124, and 126 selective to the insulating layers 121, 123, 125, and 127.

The amount of lateral recess (depth D) is controlled through a timed etch. The depth D of the lateral recess will vary depending on the target resistance of the thin film metallic resistor device to be fabricated. Based on the sidewall surface topography of the stack of insulating layers 120, an increase in the lateral recess depth D effectively results in an increase in the length of the surface topography on which the thin film metallic resistor device is formed, which results, in turn, in increasing the length $L_1$ (and thus the resistance) of the thin film metallic resistor device to be fabricated.

Figure 5:
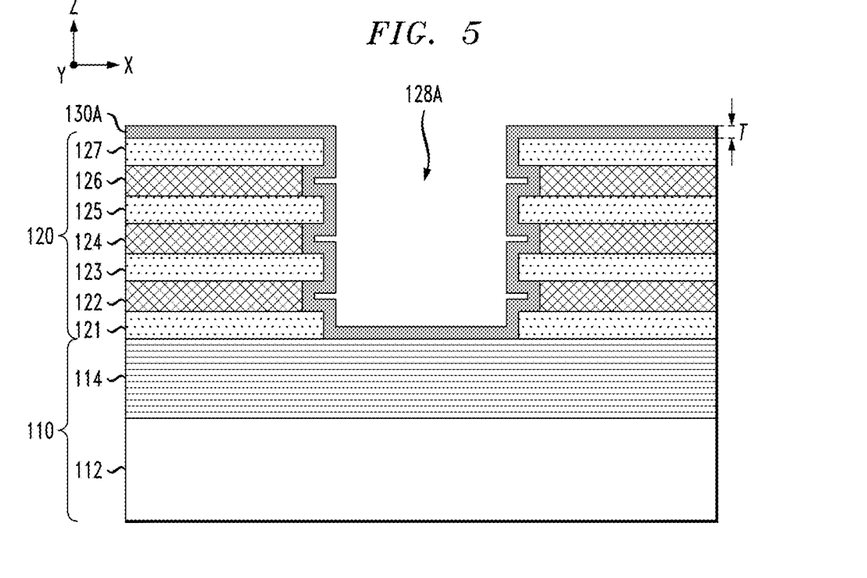
FIG. 5 is a cross-sectional schematic side view of the semiconductor structure of FIG. 4 after depositing a conformal layer of insulating material which is subsequently processed to form a thin film metallic resistor layer.

Next, FIG. 5 is a cross-sectional schematic side view of the semiconductor structure of FIG. 4 after depositing a conformal layer of insulating material 130A which is subsequently processed to form a thin film metallic resistor device. In particular, as shown in FIG. 4, the layer of insulating material 130A is formed with an initial thickness T, wherein the thickness T is in a range of about 1 nm to about 100 nm. In one embodiment of the invention, the layer of insulating material 130A comprises a material having an amorphous/orthorhombic crystal lattice structure. In particular, in one example embodiment, the layer of insulating material 130A comprises $Ta_3N_5$. In other embodiments, the layer of insulating material 130A may include an oxygen and/or nitrogen doped insulating material including, but not limited to, $Ta(N_xO_y)$, $Ti(N_xO_y)$, $Al(N_xO_y)$, $Mn(N_xO_y)$, $Ni(N_xO_y)$, $Co(N_xO_y)$, $Mn(N_xO_y)$, $Rh(N_xO_y)$, $Ir(N_xO_y)$, Ru($N_xO_y$), or W($N_xO_y$). In one embodiment, the conformal layer of insulating material 130A is deposited using ALD (atomic layer deposition) or other suitable deposition methods that provide high conformality of the deposited layer of insulating material 130A.

Figure 6:
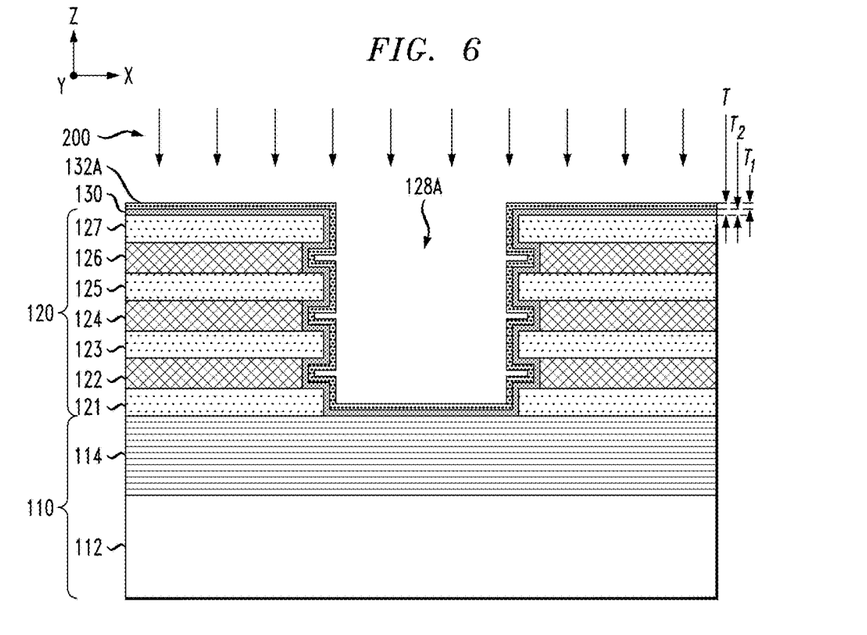
FIG. 6 is a cross-sectional schematic side view of the semiconductor structure of FIG. 5, which shows a controlled surface treatment being applied to the conformal layer of insulating material to convert an upper portion of the conformal layer of insulating material to a thin layer of conductive metallic material.

Next, a controlled surface treatment is applied to the upper surface of the conformal layer of insulating material 130A to convert the surface of the insulating layer 130A to a layer of conductive metallic material which serves as a thin film metallic resistor layer. In particular, FIG. 6 is a cross-sectional schematic side view of the semiconductor structure of FIG. 5, which shows a controlled surface treatment 200 being applied to the conformal layer of insulating material 130A to convert an upper surface portion of the layer of insulating material 130A into a thin layer of conductive metallic material 132A, which is subsequently patterned (FIG. 7) to form the thin film metallic resistor layer 132. As shown in FIG. 6, at the completion of the controlled surface treatment 200, the layer of conductive metallic material 132A has a thickness $T_1$, and a remaining (unconverted) layer of insulating material 130 has a thickness $T_2$, which is less than the original thickness T of the layer of insulating material 130A (as shown in FIG. 5), wherein $T=T_1+T_2$. For example, in one embodiment where the original thickness T of the layer of insulating material 130A is in a range of about 1 nm to about 100 nm, the controlled surface treatment 200 allows the formation of the layer of conductive metallic material 132A having a thickness $T_1$ of about 0.5 nm or greater.

The controlled surface treatment 200 allows precise control of the thickness $T_1$ of the layer of conductive metallic material 132A, wherein the parameters of the controlled surface treatment 200 can be selected to precisely control the depth (e.g., thickness $T_1$) of the transformation of the surface of the insulating layer 130A from an insulating material to a conductive metallic material. As noted above, the resistance of a thin film metallic resistor is inversely proportional to the thickness of the layer of conductive metallic material 132A. In this regard, the controlled surface treatment 200 provides an optimal process to precisely control the surface depth of the layer of insulating material 130A which is converted into the layer of conductive metallic material 132A to obtain a target thickness $T_1$ for the thin film metallic resistor, as opposed to simply depositing an ultrathin conductive metallic film using standard deposition methods which provide less-precision thickness control.

In general, the controlled surface treatment 200 shown in FIG. 6 is applied to transform the amorphous/orthorhombic crystal lattice structure of the upper surface portion of the layer of insulating material 130A into a conductive metallic material having a polycrystalline/cubic crystal lattice structure. For example, in one embodiment of the invention, when the layer of insulating material 130A is formed of $Ta_3N_5$, the surface treatment 200 can be implemented to convert the insulating $Ta_3N_5$ material into a conductive TaN metallic material, which has a cubic lattice structure. Similarly, when the layer of insulating material 130A is formed of an oxygen and/or nitrogen doped insulating material (e.g., Ta($N_xO_y$), Ti($N_xO_y$), Al($N_xO_y$), Mn($N_xO_y$), Ni($N_xO_y$), Co($N_xO_y$), Mn($N_xO_y$), Rh($N_xO_y$), Ir($N_xO_y$), Ru($N_xO_y$), or W($N_xO_y$)), the surface treatment modifies the composition/concentration of the constituent elements of the insulating materials in a way that transforms the insulating material into a conductive metallic material with a lattice structure of the insulating material transformed from an amorphous/orthorhombic structure into a polycrystalline/cubic structure.

The controlled surface treatment 200 of FIG. 6 can be implemented using various methods. For example, the controlled surface treatment 200 can be implemented using a plasma bombardment process, an ion implantation process, a gas cluster ion beam (GCIB) process, or a neutral atom beam (NAB) technique. In general, these surface treatment techniques involve a bombardment process in which the surface of the layer of insulating material 130A is bombarded with high energy particles to cause transformation of the insulating material into a conductive metallic material.

For example, for a plasma treatment process, a plasma can be generated using a precursor gas such as $N_2$, $HH_3$, $H_2$, $N_2H_2$, or mixtures thereof, etc. in an inert atmosphere of He or Ar. In addition, in one embodiment, the plasma treatment is performed in a suitable chamber at a temperature in a range of about 80 degrees Celsius to about 900 degrees Celsius, with a plasma energy in a range of about 0.1 keV to about 2.0 keV. A plasma process enables the surface of layer of insulating material 130A to be chemically altered through infusion at a controlled penetration depth of 10 nm or greater. Similarly, an ion implantation process can be implemented with a suitable mixture of gases (as noted above) and an energy in a range of about 10 keV to about 200 keV to chemically alter the surface of the layer of insulating material 130A through infusion at a controlled penetration depth of 50 nm or greater.

The GCIB and NAB treatment methods are technologies that enable nano-scale modification of surfaces, e.g., chemically alter surfaces through infusion. With GCIB, a surface of the layer of insulating material 130A is bombarded by a beam of high energy nanoscale cluster ions, which are formed when a high pressure gas (e.g., 10 atmospheres pressure) expands into a vacuum. In one example embodiment, a GCIB treatment can be implemented with a suitable mixture of gases (as noted above) and an energy in a range of about 10 keV to about 30 keV to chemically alter the surface of the layer of insulating material 130A through infusion at a controlled penetration depth of less than about 10 nm. Similarly, a NAB surface treatment enables ultra-shallow processing of surfaces by converting energized gas cluster ions produced by a GCIB method into intense collimated beams of coincident neutral gas atoms having controllable average energies from about 10 eV per atom to about 100 eV per atom. An electrostatic deflector is used to eliminate charged species in the environment, while allowing the released neutral atoms to bombard the target surface and produce effects similar to those normally associated with GCIB, but to shallower depths (e.g., about 3 nm or less).

Figure 7:
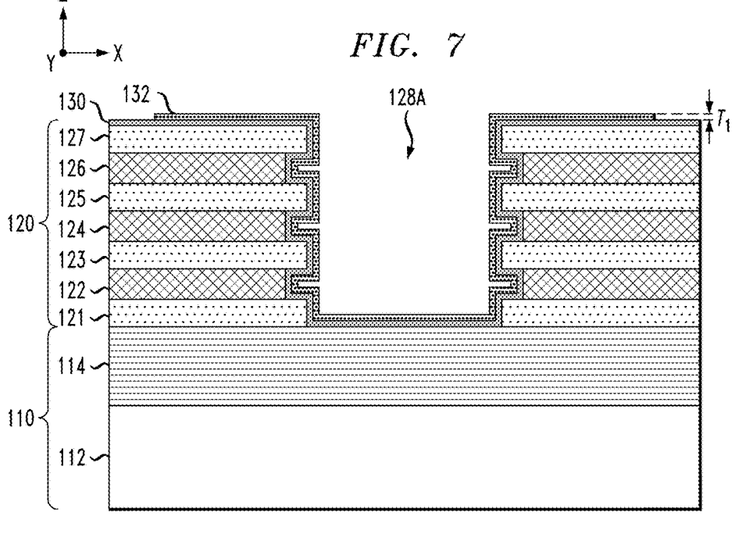
FIG. 7 is a cross-sectional schematic side view of the semiconductor structure of FIG. 6 after patterning the thin layer of conductive metallic material to form a thin film metallic resistor layer.

Next, FIG. 7 is a cross-sectional schematic side view of the semiconductor structure of FIG. 6 after patterning the layer of conductive metallic material 132A to form the thin film metallic resistor layer 132. The layer of conductive metallic material 132A in FIG. 6 can be patterned using standard photolithography patterning techniques, for example, to etch away portions of the layer of conductive metallic material 132A in the field regions of the semiconductor structure and form separate thin film metallic resistor elements (e.g., the thin film metallic resistor layer 132).

Figure 8:
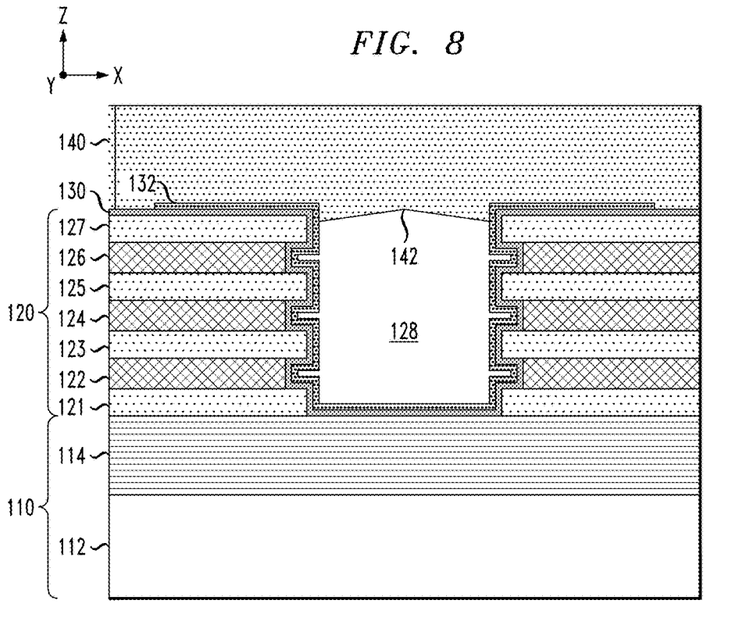
FIG. 8 is a cross-sectional schematic side view of the semiconductor device of FIG. 7 after forming a layer of dielectric material to cause pinch-off of the dielectric material over the opening in the stack of insulating layers to form an insulating air gap.
Figure 9:
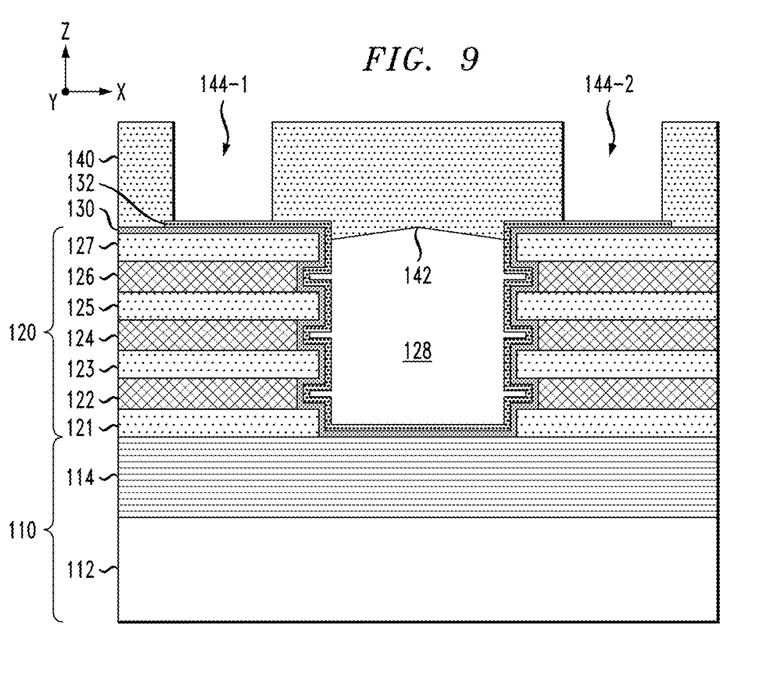
FIG. 9 is a cross-sectional side view of the semiconductor structure of FIG. 8 after pattering the layer of dielectric material to form contact openings down to end portions of the thin film metallic resistor layer.
Figure 10:
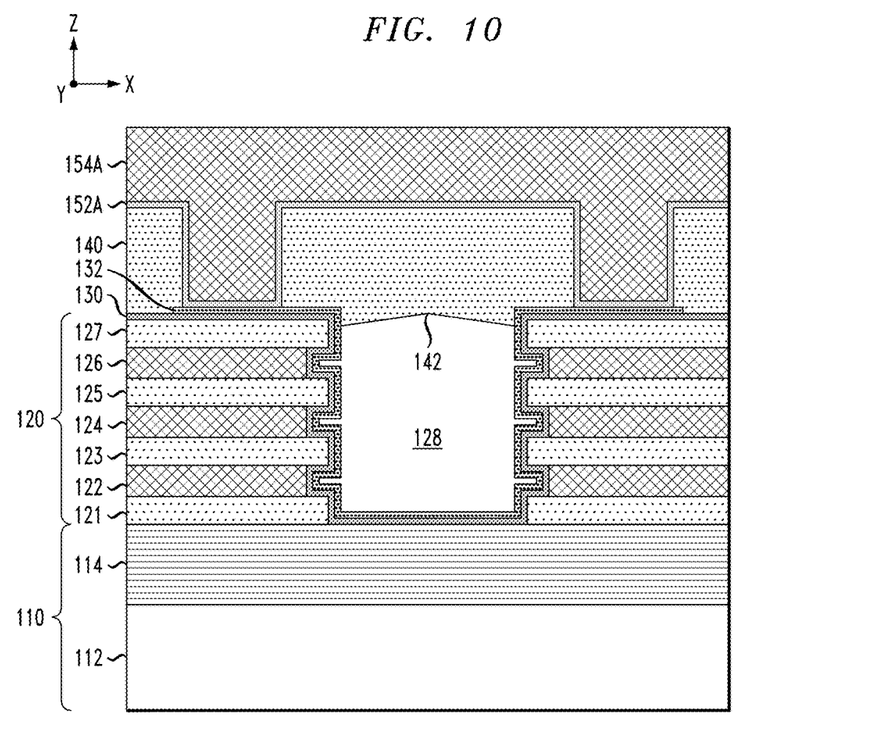
FIG. 10 is a cross-sectional side view of the semiconductor structure of FIG. 9 after depositing a conformal layer of liner material and a layer of metal material to fill the contact openings in the layer of dielectric material with metal material that is subsequently planarized to form device contacts to the thin film metallic resistor layer.

A next stage of the fabrication process comprises forming device contacts to the thin film metallic resistor layer 132 using a process flow as schematically illustrated in FIGS. 8, 9 and 10. For example, FIG. 8 is a cross-sectional schematic side view of the semiconductor device of FIG. 7 after forming a layer of dielectric material 140 to cause a pinch-off of the dielectric material over the opening 128A in the stack of insulating layers 120 to form the insulating air gap

128. In one embodiment of the invention, the layer of dielectric material 140 is formed by a process which comprises depositing a layer of dielectric material over the semiconductor structure of FIG. 7 using a "pinch-off" deposition process, followed by planarization of the deposited layer dielectric material to obtain the semiconductor structure shown in FIG. 8.

The layer of dielectric material 140 is deposited using a non-conformal deposition process (e.g., PECVD or PVD) to cause a pinch-off region 142 to form in the deposited dielectric material 140 over the opening 128A formed in the stack of insulating layers 120. For example, in one embodiment of the invention, the layer of dielectric material 140 is formed by PECVD deposition of a low-k dielectric material (e.g., k in a range of about 2.0 to about 5.0) such as, but is not limited to, silicon oxide (e.g. $SiO_2$), silicon nitride (e.g., $Si_3N_4$), silicon carbide (SiC), hydrogenated silicon carbon oxide (SiCOH), porous p-SiCOH, SiCN, carbon-rich SiCNH, p-SiCNH, etc. The thickness of the layer of dielectric material 140 will vary depending on the application, and may have a thickness in a range of about 30 nm to about 200 nm, for example.

Furthermore, depending on the given application and the dimensions of the insulating air gate structure, a target level of conformality of the PECVD deposited dielectric material can be achieved by adjusting the deposition process parameters. For example, for PECVD dielectric materials such as SiN, SiCN, SiCOH, porous p-SiCOH, and other ULK dielectric materials, a lower level of conformality can be obtained by increasing the RF power, increasing the pressure and/or increasing the deposition rate (e.g., increase flow rate of precursor materials). As the level of conformality decreases, the "pinch-off" regions are formed with minimal deposition of the dielectric material on the exposed sidewall and bottom surfaces within the opening 128A, thereby resulting in the formation of the insulating air gap 128.

The dielectric constant of air is about unity, which is much less than the dielectric constant of the dielectric material that is used to form the dielectric layer 140. In this regard, the ability to eliminate or minimize the amount of dielectric material that is deposited within the opening 128A using a pinch-off deposition process enables optimization of the electrical performance of the thin film metallic resistor device by reducing potential parasitic capacitances and preventing TDDB (time-dependent dielectric breakdown) of low-k dielectric materials which generally have weaker intrinsic breakdown strength than traditional $SiO_2$ dielectrics. TDDB refers to the loss of the insulating properties of a dielectric when it is subjected to voltage/current bias and temperature stress over time. TDDB causes an increase in leakage current and, thus, degrades performance in nanoscale integrated circuits.

In the embodiment of FIG. 8, the formation of the insulating air gap 128 provides air spaces between closely spaced portions of the thin film metallic resistor layer 132, e.g., between the upper and lower lateral portions of the thin film metallic resistor layer 132 within the recesses of the meandering sidewall topology of the stack of insulating layers 120. As such, the insulating air spaces in these regions reduces coupling between adjacent, closely spaced length portions of the thin film metallic resistor layer 132 and avoids the potential for TDDB of dielectric material if the air gap 128 was otherwise filled with dielectric material when forming the dielectric layer 140.

Next, FIG. 9 is a cross-sectional side view of the semiconductor structure of FIG. 8 after patterning the layer of dielectric material 140 to form contact openings 144-1 and 144-2 down to end portions of the thin film metallic resistor layer 132. The layer of dielectric material 140 can be patterned using standard photolithography techniques to form the contact openings 144-1 and 144-2. In addition, FIG. 10 is a cross-sectional side view of the semiconductor structure of FIG. 9 after sequentially depositing a conformal layer of liner material 152A and a layer of metal material 154A to fill the contact openings 144-1 and 144-2 in the layer of dielectric material 140 with metal material which is used to form the device contacts 150-1 and 150-2 (FIG. 1) to the thin film metallic resistor layer 132.

In particular, as shown in FIG. 10, the conformal layer of liner material 152A is deposited to line the sidewall and bottom surfaces of the contact openings 144-1 and 144-2 1 in the layer of dielectric material 140 with a thin liner. The liner material may include one or more thin layers of material such as, for example, tantalum nitride (TaN), titanium nitride (TiN), cobalt (Co), ruthenium (Ru), tungsten nitride (WN), manganese (Mn), manganese nitride (MnN) or other liner materials (or combinations of liner materials) such as RuTaN, Ta/TaN, CoWP, NiMoP, NiMoB) which are suitable for the given application. As noted above, the thin liner layer serves as a barrier diffusion layer and adhesion layer. The conformal layer of liner material 152A is deposited using known techniques such as CVD, ALD, PVD, etc.

Moreover, the layer of metal material 154A comprises a metal material such as, e.g., copper (Cu), aluminum (Al), tungsten (W), cobalt (Co), ruthenium (Ru), iridium (Ir), rhodium (Rh), nickel (Ni), or alloys thereof. The layer of metal material 154A is deposited using known techniques such as electroplating, electroless plating, CVD, PVD, or a combination of methods. The type of metal material and deposition method used to deposit the layer of metal material 152A can depend on whether the process steps of FIGS. 8, 9 and 10 are part of a MOL process flow or BEOL process flow. Prior to filling the contact openings 140-1 and 140-2 with the metal material 154A, a thin seed layer (e.g., Cu seed layer) may optionally be deposited (on the conformal liner layer 152A) using a suitable deposition technique such as ALD, CVD or PVD. The seed layer can be formed of a material which enhances adhesion of the metal material on the underlying material and which serves as catalytic material during a subsequent plating process.

For example, a thin conformal Cu seed layer can be deposited over the surface of liner layer 152A using PVD, followed by the electroplating of Cu to fill the contact openings 140-1 and 140-2 with Cu material. The overburden liner, seed, and metallization materials are then removed by performing a chemical mechanical polishing process (CMP) to planarize the surface of the semiconductor structure down to the layer of dielectric material 140 and form the semiconductor device 100 with the integrated metallic resistor device as shown in FIGS. 1A and 1B. Following the formation of the semiconductor device 100 shown in FIGS. 1A and 1B, one or more additional interconnect levels can be formed over the dielectric layer 140 using standard MOL and/or BEOL process flows.

It is to be understood that the methods discussed herein for fabricating thin film metallic resistor elements in MOL or BEOL layers can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a device, comprising:
   depositing a conformal layer of insulating material on a substrate, wherein the conformal layer of insulating layer is formed with an initial thickness T, and wherein the conformal layer of insulating material comprises $Ta_3N_5$ insulating material;
   applying a surface treatment to a surface of the conformal layer of insulating material to convert the surface of the conformal layer of insulating material to a layer of conductive TaN metallic material of thickness $T_1$, which is less than T; and
   forming device contacts to portions of the layer of conductive metallic material;
   wherein the layer of conductive metallic material and device contacts comprise a thin film metallic resistor device.

2. The method of claim 1, wherein applying the surface treatment to the surface of the conformal layer of insulating material comprising performing at least one of a plasma bombardment process, an ion implantation process, a gas cluster ion beam (GCIB) process, and a neutral atom beam (NAB) process.

3. The method of claim 1 wherein applying the surface treatment comprises bombarding the surface of the conformal layer of insulating material with high energy particles to chemically convert the insulating material comprising an orthorhombic crystal structure into a conductive metallic material comprising a cubic crystal structure.

4. A method for fabricating a device, comprising:
   forming a stack of insulating layers on a substrate;
   patterning the stack of insulating layers to form an opening in the stack of insulating layers down to the substrate, wherein the opening comprises vertical sidewalls;
   laterally recessing exposed sidewall surfaces of every other insulating layer in the stack of insulating layers to a recess depth D to form a meandering sidewall topology on the vertical sidewalls;
   depositing a conformal layer of insulating material over the patterned stack of insulating layers, wherein the conformal layer of insulating layer is formed with an initial thickness T, and wherein the conformal layer of insulating material comprises $Ta_3N_5$ insulating material;
   applying a surface treatment to a surface of the conformal layer of insulating material to convert the surface of the conformal layer of insulating material to a layer of conductive TaN metallic material of thickness $T_1$, which is less than T;
   patterning the layer of conductive metallic material to form a thin film metallic resistor layer;
   depositing a layer of dielectric material to form an insulating air gap in the opening in the stack of insulating layers; and
   forming device contacts in the layer of dielectric material in contact with portions of the thin film metallic resistor layer.

5. The method of claim 4, wherein applying the surface treatment to the surface of the conformal layer of insulating material comprises performing at least one of a plasma bombardment process, an ion implantation process, a gas cluster ion beam (GCIB) process, and a neutral atom beam (NAB) process.

6. The method of claim 4, wherein applying the surface treatment comprises bombarding the surface of the conformal layer of insulating material with high energy particles to chemically convert the insulating material comprising an orthorhombic crystal structure into a conductive metallic material comprising a cubic crystal structure.

7. The method of claim 4, wherein the stack of insulating layers, the thin film metallic resistor layer, the dielectric layer, and the device contacts are formed as part of a MOL (middle-of-the-line) layer of a semiconductor device.

8. The method of claim 4, wherein the stack of insulating layers, the thin film metallic resistor layer, the dielectric layer, and the device contacts are formed as part of a BEOL (back-end-of-line) layer of a semiconductor device.

9. The method of claim 4, wherein forming the stack of insulating layer on the substrate comprises sequentially forming alternating layers of a first type of insulating material and a second type of insulating material, which has an etch selectivity with respect to the first type of insulating material.

10. The method of claim 1, wherein the first type of insulating material comprises a silicon oxide material, and wherein the second type of insulating material comprises a silicon carbide material.

* * * * *